US007418102B2

(12) United States Patent
Hama

(10) Patent No.: US 7,418,102 B2
(45) Date of Patent: Aug. 26, 2008

(54) BROAD-BAND ECHO SOUNDER

(75) Inventor: Yoshinori Hama, Tokyo (JP)

(73) Assignee: NEC Corporation, Minato-Ku, Tokyo (JP)

( * ) Notice: Subject to any disclaimer, the term of this patent is extended or adjusted under 35 U.S.C. 154(b) by 790 days.

(21) Appl. No.: 10/309,430

(22) Filed: Dec. 4, 2002

(65) Prior Publication Data

US 2003/0118195 A1 Jun. 26, 2003

(30) Foreign Application Priority Data

Dec. 7, 2001 (JP) ............................ 2001-374433

(51) Int. Cl.
*H03B 29/00* (2006.01)
*G10K 11/16* (2006.01)

(52) U.S. Cl. ....................... 381/71.1; 310/325; 310/321

(58) Field of Classification Search ................ 381/71.1; 310/325, 321, 311, 324, 322
See application file for complete search history.

(56) References Cited

U.S. PATENT DOCUMENTS 3,378,814 A * 4/1968 Butler ........................ 367/157
4,065,687 A * 12/1977 Mishiro ...................... 310/314
4,779,020 A * 10/1988 Konno et al. ................ 310/325
6,291,932 B1 * 9/2001 Maruyama et al. .......... 310/366

FOREIGN PATENT DOCUMENTS

JP 2000-209690 7/2000
JP 2001-148896 5/2001

* cited by examiner

*Primary Examiner*—Vivian Chin
*Assistant Examiner*—Con P Tran
(74) *Attorney, Agent, or Firm*—Scully, Scott, Murphy & Presser, P.C.

(57) ABSTRACT

An echo sounder includes front and rear masses and a layered product of piezoelectric ceramics sandwiched therebetween, and a hollow space is formed in the front mass for defining a bending vibratory plate portion; a ring-shaped piezoelectric vibrator is accommodated in the hollow space, and has flat major surface or an outer side surface held in contact with the front mass without being fixed to the bending vibratory plate; while the layered product of piezoelectric ceramics gives rise to bending vibrations in the bending vibratory plate, the ring-shaped piezoelectric vibrator is driven for vibrations at the resonant frequency so that an acoustic wave with a large amplitude is radiated from the echo sounder; the bending vibratory plate and ring-shaped piezoelectric vibrator are independently designed so that the echo sounder achieves a high acoustic radiation efficiency without sacrifice of high withstand water pressure.

19 Claims, 14 Drawing Sheets

BROAD-BAND ECHO SOUNDER

FIELD OF THE INVENTION

This invention relates to an echo sounder and, more particularly, to an echo sounder of the type having a Langevin vibrator.

DESCRIPTION OF THE RELATED ART

A typical example of the echo sounder of the type having a Langevin vibrator is shown in FIGS. 1 and 2. The prior art echo sounder comprises a front mass 1, a rear mass 2, a layered product of piezoelectric ceramics 3 and a bolt 9. The front mass 1 has a frusto-conical configuration, and the rear mass 2 has a column shape. The layered product of piezoelectric ceramics 3 is cylindrical. A female thread is formed in the front mass 1, and a through-hole is formed in the rear mass. The layered product of the piezoelectric ceramics 3 is sandwiched between the front mass 1 and the rear mass 2. The bolt 9 passes through the rear mass 3 and the layered product of piezoelectric ceramics 3, and engaged with the female thread formed in the front mass 1. As a result, the front mass 1 and rear mass 3 exert the force on the layered product of piezoelectric ceramics 3, and the layered product 2 is held between the front mass 1 and the rear mass 3. The layered product of piezoelectric ceramics 3 serves as a Langevin vibrator.

The prior art echo sounder is dipped in water, and applies potential difference to the Langevin vibrator. The Langevin vibrator gives rise to longitudinal vibrations of the front mass 1, and acoustic radiation is output from the front surface 1*a* of the front mass 1.

User wants to generate broad-band acoustic radiation through the echo sounder. A technique for the broad-band acoustic radiation is disclosed in Japan Patent Application laid-open 2000-209690. The prior art echo sounder disclosed in the Japan Patent Application laid-open is shown in FIGS. 3 and 4. The prior art echo sounder disclosed in the Japan Patent Application laid-open is similar in structure to the prior art echo sounder shown in FIGS. 1 and 2 except a front mass 1A. For this reason, the other component parts are labeled with references designating the corresponding component parts of the echo sounder shown in FIGS. 1 and 2. The front mass 1A is formed with a hollow space 4, and the hollow space 4 makes the front surface portion serve as a bending vibratory plate 7. When the layered product of piezoelectric ceramics is applied with the potential difference, the layered product of piezoelectric ceramics 2 gives rise to bending vibrations of the bending vibratory plate 7 as well as the longitudinal vibrations of the front mass 1. The bending vibrations are superimposed on the longitudinal vibrations. As a result, a broad-band acoustic radiation is output from the front mass 1.

Yet another prior art broad-band echo sounder is disclosed in Japan Patent Application laid-open 2001-148896, and is shown in FIGS. 5 and 6. The prior art board-band echo sounder disclosed in the Japan Patent Application laid-open is also similar to the prior art echo sounder shown in FIGS. 1 and 2 except a front mass 1C. The front mass 1C is formed with the follow space 4, and a piezoelectric vibratory disc 5 is embedded in the bending vibratory plate 7. Though not shown in FIGS. 5 and 6, a driving circuit is connected to the piezoelectric vibratory disc 5, and controls the amplitude and phase of the bending vibrations of the bending vibratory plate 7. The bending vibrations are superimposed on the longitudinal vibrations, and a broad-band acoustic radiation is output from the front mass 1C.

A problem is encountered in the prior art broad-band echo sounder shown in FIGS. 3 and 4 in the lower limit of the frequency band. In detail, the frequency of the bending vibrations is dominated by the resonant frequency of the bending vibratory plate 7, and the thickness of the bending vibratory plate 7 and the diameter of the hollow space 4 have influences on the resonant frequency of the bending vibratory plate 7. In case where the resonant frequency is to be lowered, the manufacturer increases the diameter of the hollow space 4, or decreases the thickness of the bending vibratory plate 7. However, the echo sounders are dipped in water such as seawater. This means that the water pressure is exerted on the front surface portion, i.e., the bending vibratory plate 7 of the front mass 1A/1C. If the bending vibratory plate 7 is too thin, the bending vibratory plate 7 is broken in the water. In order to withstand the water pressure, the bending vibratory plate 7 is to be thick, or the hollow space 4 is to be small in diameter. For this reason, the lower limit of the frequency band is hardly lowered.

Another factor is large radiation impedance in the water. The longitudinal vibrations are radiated from the front surface of the bending vibratory plate 7 so that the bending vibratory plate 7 offers an acoustic radiation surface to the longitudinal vibrations and bending vibrations. This means that the front surface is expected to drive large acoustic load due to the water pressure for vibrations. If the bending vibratory plate 7 is too thin, the bending vibratory plate 7 is inwardly warped, and high-order bending distortions take place in the acoustic radiation surface. This results in reduction of acoustic radiation efficiency. As to the longitudinal vibrations, similar phenomena take place, and the acoustic radiation efficiency is also reduced.

In more detail, the acoustic radiation surface repeatedly pushes the water for generating the sound pressure. However, if the high-order bending vibrations take place in the thin bending vibratory plate 7, the high-order bending vibrations give rise to the inward warp and high-order bending distortions in the thin bending vibratory plate 7, and the negative/positive local displacements are canceled each other, and only a small amount of water is displaced by the bending vibratory plate 7. This results in the low acoustic radiation efficiency.

The problem inherent in the prior art echo sounder shown in FIGS. 3 and 4 is less serious to the prior art echo sounder shown in FIGS. 5 and 6, because the piezoelectric vibratory disc 5 forcibly drives the bending vibratory plate 7 for vibrations. However, the piezoelectric vibratory disc 5 and bending vibratory plate 7 are a unity. This means that the resonant frequency is dominated by the total thickness of the piezoelectric vibratory disc/bending vibratory plate 5/7. Even if the bending vibratory plate 7 is made thin, the piezoelectric vibratory disc 5 increases the total thickness, and the resonant frequency remains high. This is the first problem inherent in the prior art echo sounder shown in FIGS. 5 and 6.

Another problem inherent in the prior art echo sounder shown in FIGS. 5 and 6 is a relatively narrow bandwidth. The piezoelectric vibratory disc 5 is usually larger in density than the bending vibratory plate 7. When the high dense piezoelectric material is combined with the bending vibratory plate 7, the vibrations have a sharp peak at the resonant frequency, and the bandwidth becomes narrow.

Thus, the bending vibratory plate 7 and piezoelectric vibratory disc 5 insufficiently widen the bandwidth, and the resonant frequency and withstand water pressure set limits to the design work on the echo sounder.

SUMMARY OF THE INVENTION

It is therefore an important object of the present invention to provide an echo sounder, which enhances the flexibility of the design work.

It is also an important object of the present invention to provide an echo sounder, which exhibits a bandwidth spread toward the lower frequency side without sacrifice of the withstand water pressure.

It is another important object of the present invention to provide an echo sounder, which is operative in a broad band without a sharp peak at the resonant frequency of the bending vibrations.

It is still another important object of the present invention to provide an echo sounder, which achieves a high acoustic radiation efficiency in both bending and longitudinal vibrations by preventing an acoustic radiation surface from an inward warp and high-order displacement.

It is yet another important object of the present invention to provide an echo sounder, which achieves a high acoustic radiation efficiency through a wide amplitude of vibrations generated by a piezoelectric vibrator.

In accordance with one aspect of the present invention, there is provided an echo sounder for radiating an acoustic wave comprising, a front mass including a bending vibratory plate portion vibratory for radiating the acoustic wave and a remaining portion partially spaced from the bending vibratory plate portion for defining a hollow space, a rear mass spaced from the front mass, a first vibrator sandwiched between the from mass and the rear mass and giving rise to vibrations of the bending vibratory plate portion, and a second vibrator accommodated in the hollow space, and having at least one surface held in contact with the front mass without being fixed to the bending vibratory plate so as to give rise to enlarge the vibrations.

BRIEF DESCRIPTION OF THE DRAWINGS

The features and advantages of the echo sounder will be more clearly understood from the following description taken in conjunction with the accompanying drawings, in which.

DETAILED DESCRIPTION OF THE INVENTION

Figure 1:
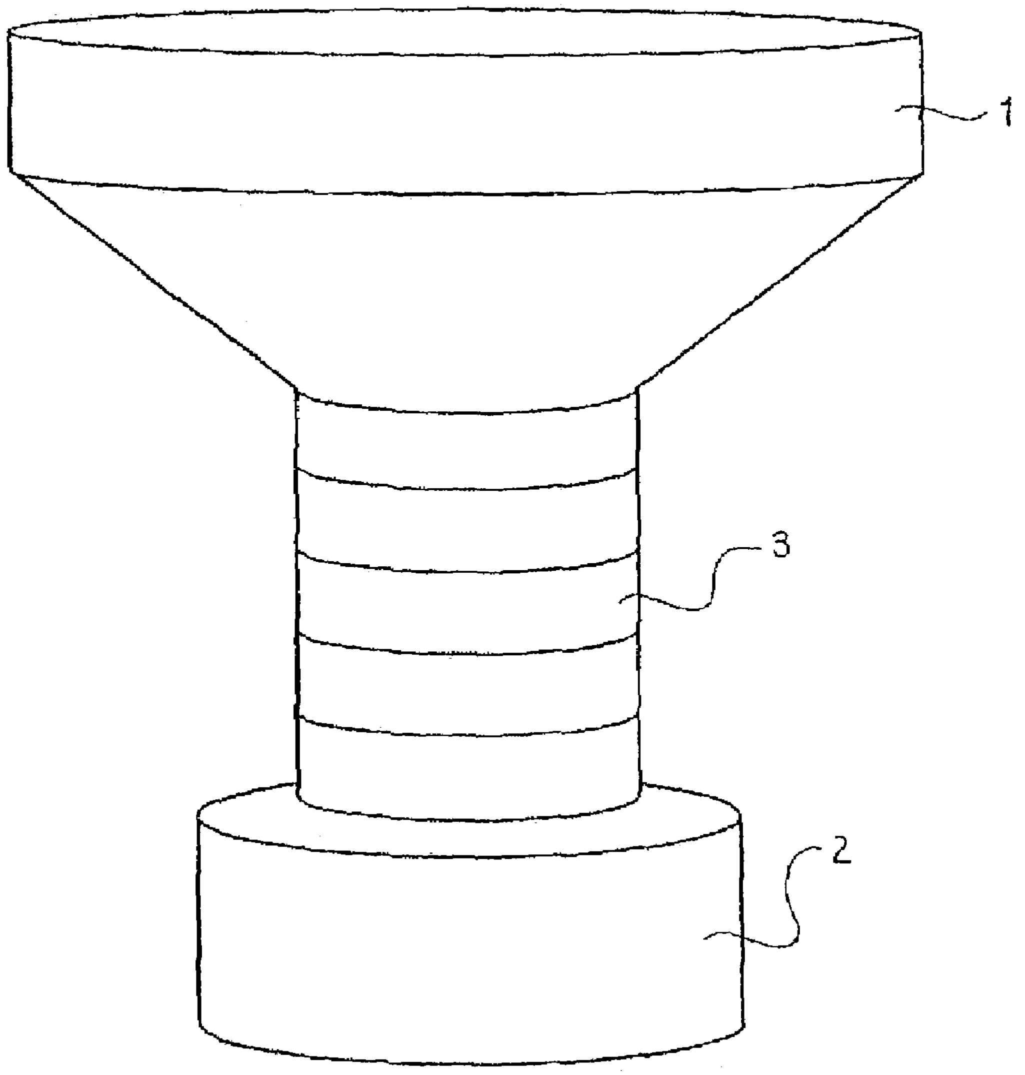
Fig. 1 PRIOR ART
FIG. 1 is a perspective view showing the appearance of the prior art echo sounder.
Figure 2:
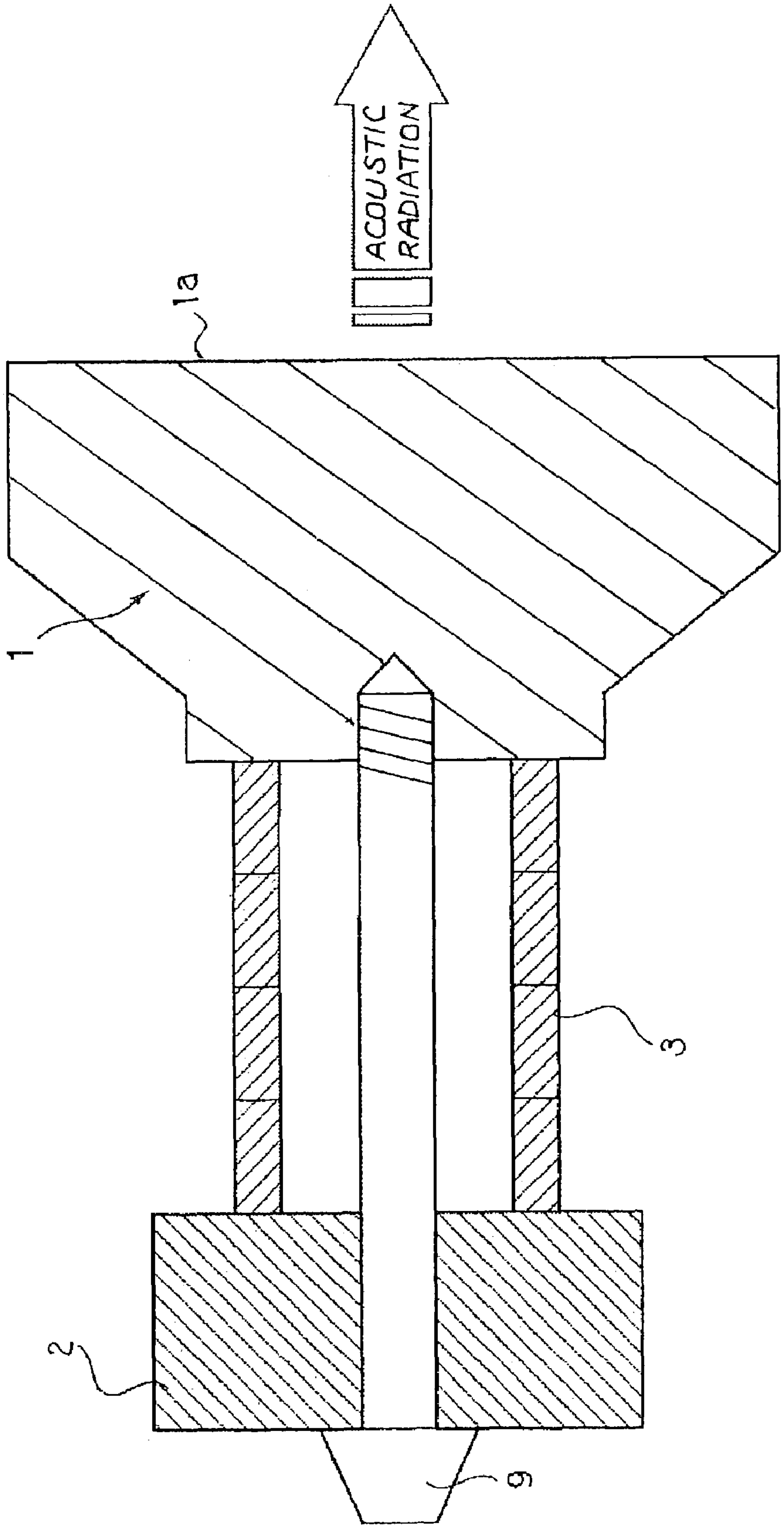
Fig. 2 PRIOR ART
FIG. 2 is a cross sectional side view showing the prior art echo sounder.
Figure 3:
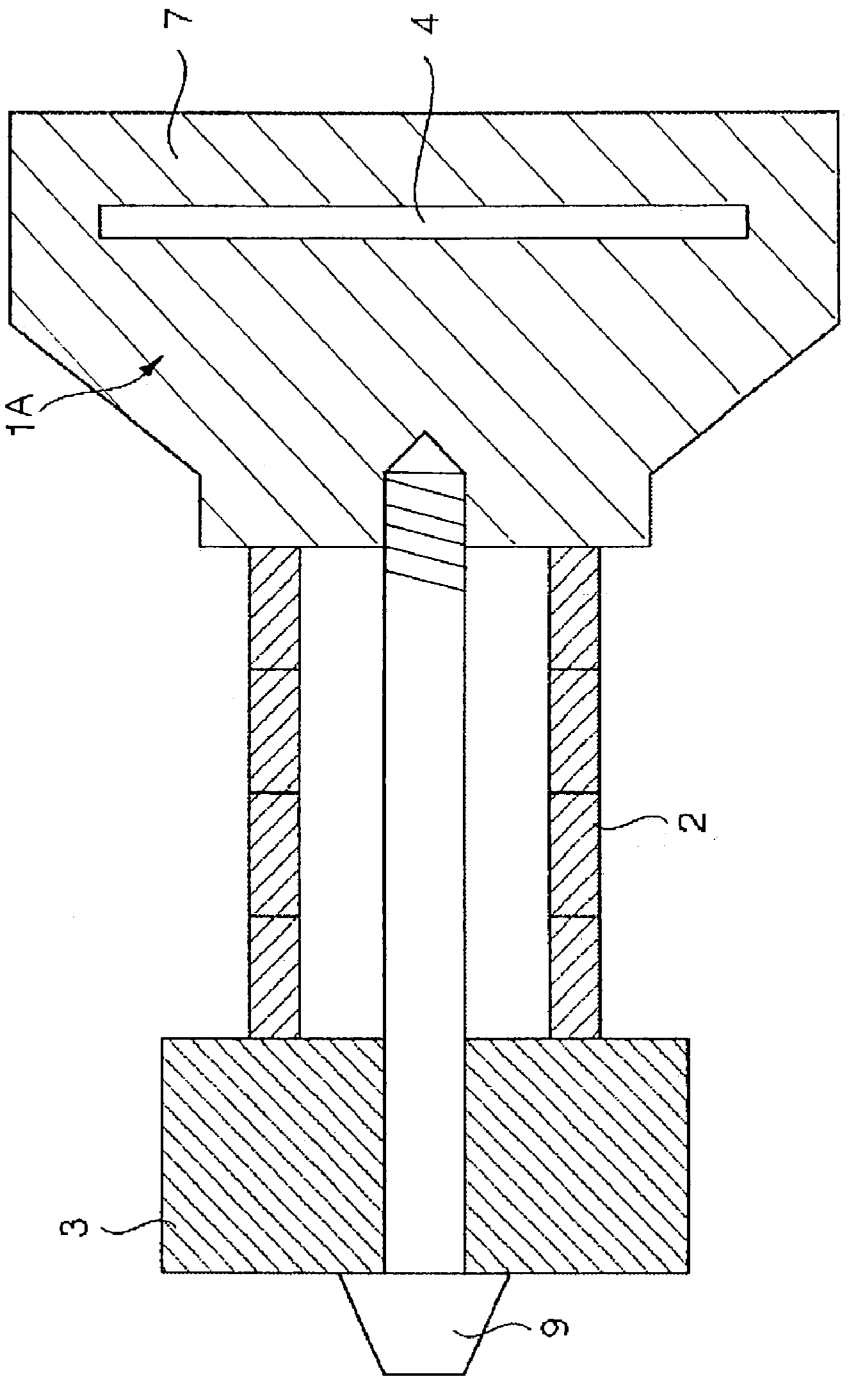
Fig. 3 PRIOR ART
FIG. 3 is a cross sectional side view showing the appearance of the prior art echo sounder disclosed in Japan Patent Application laid-open No. 2000-209690.
Figure 4:
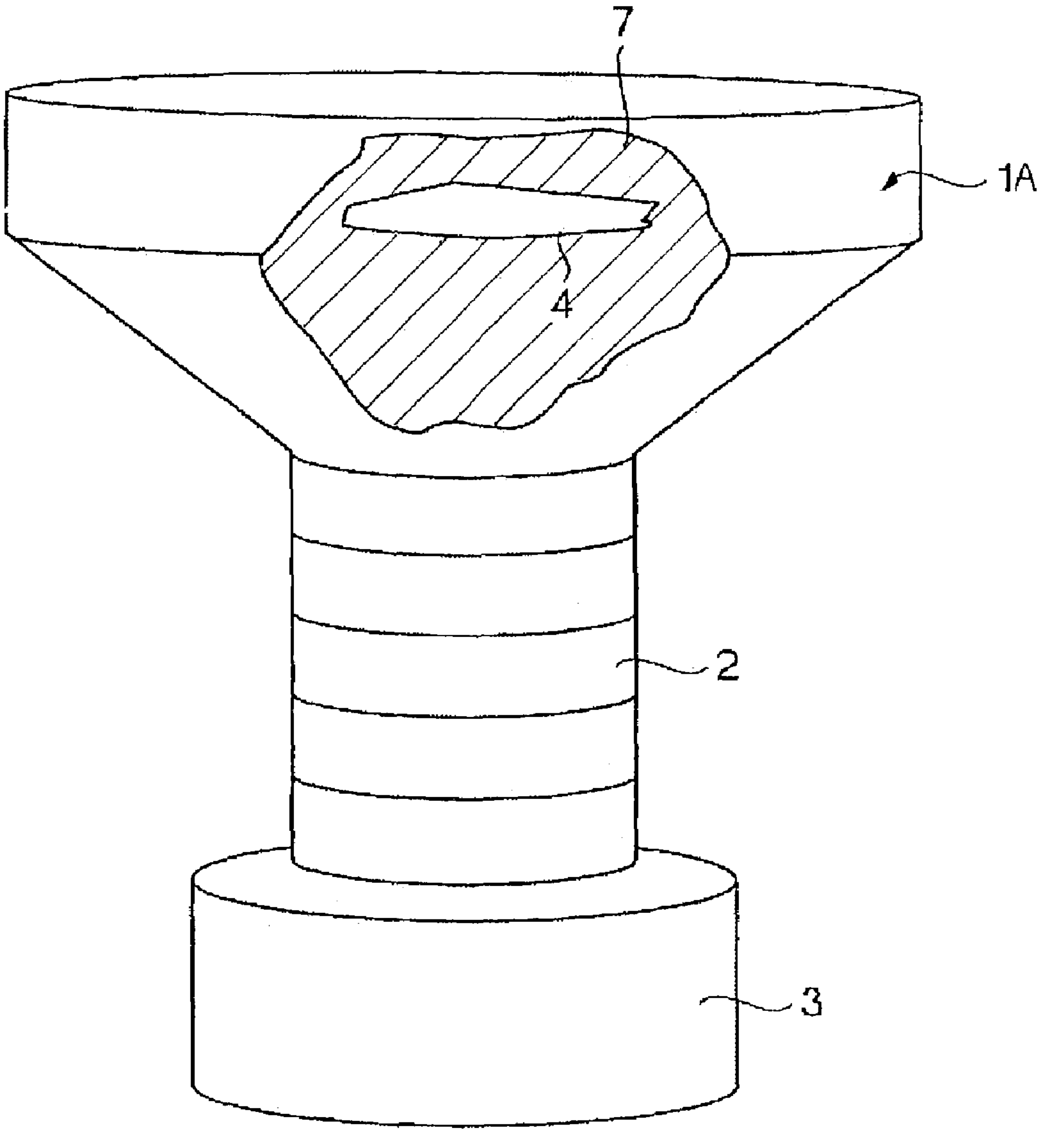
Fig. 4 PRIOR ART
FIG. 4 is a partially cut-off perspective view showing the prior art echo sounder.
Figure 5:
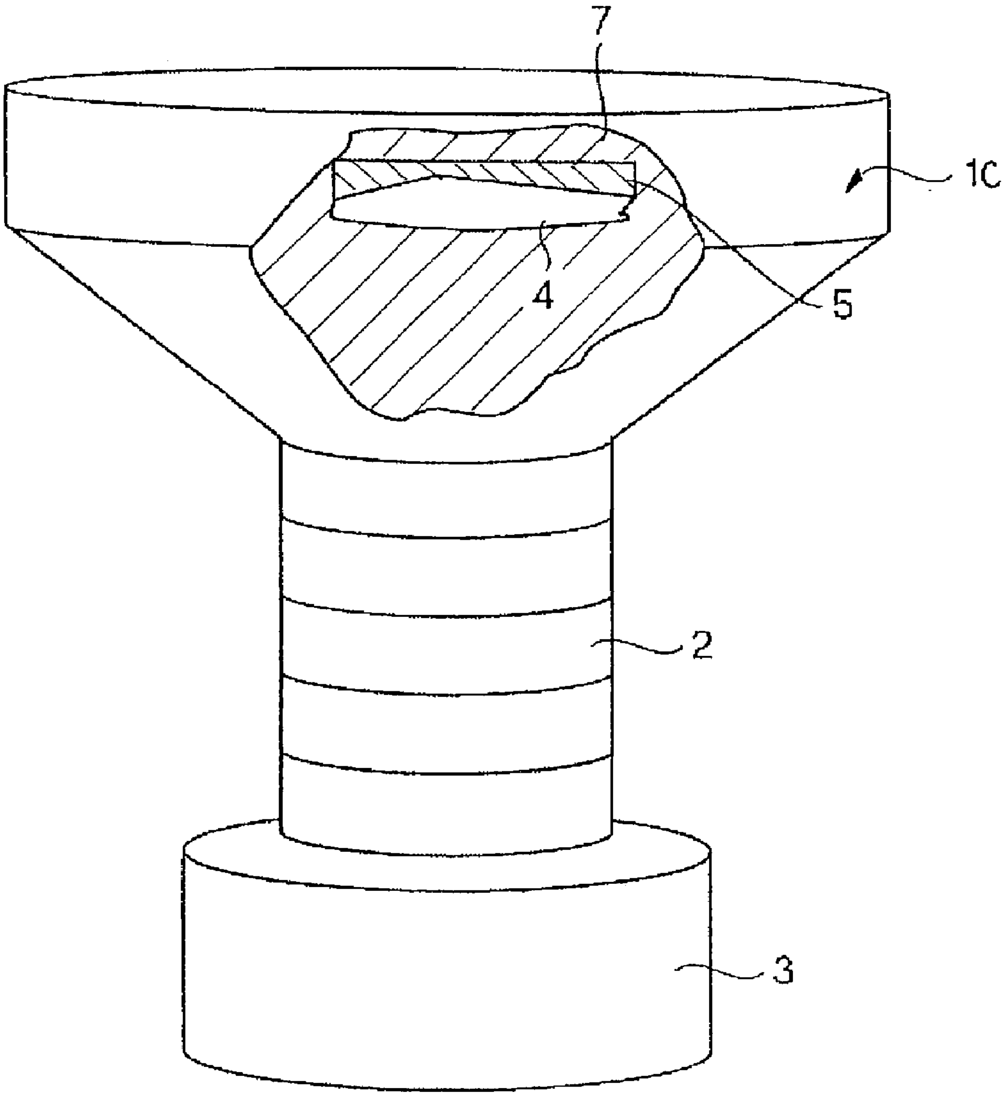
Fig. 5 PRIOR ART
FIG. 5 is a partially cut-off perspective view showing the appearance of the prior art echo sounder disclosed in Japan Patent Application laid-open No. 2001-148896.
Figure 6:
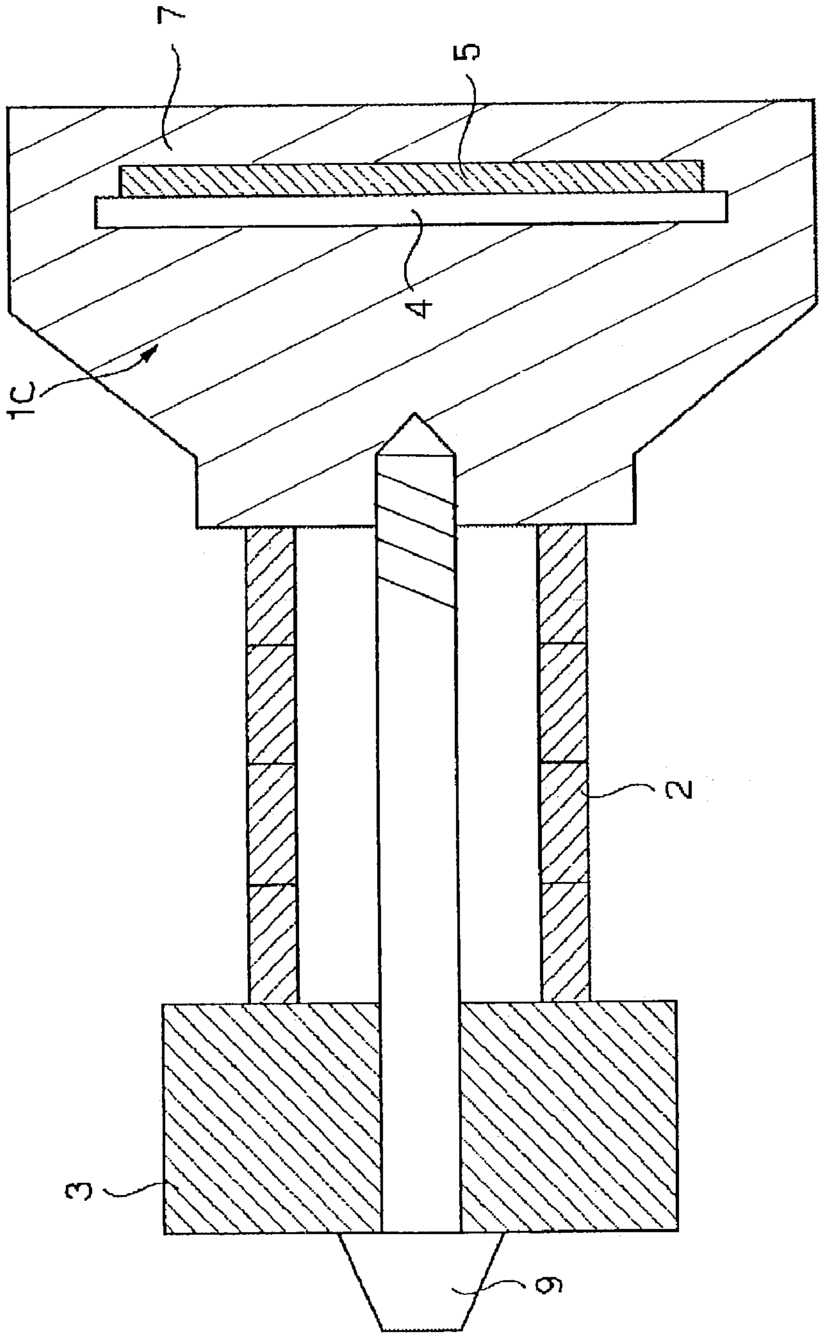
Fig. 6 PRIOR ART
FIG. 6 is a cross sectional side view showing the prior art echo sounder.

An echo sounder according to the present invention comprises a front mass, a rear mass and a vibrator provided between the front mass and the rear mass. The front mass has an acoustic radiation surface, and a disc-shaped hollow space is formed in the front mass. The front surface portion between the disc-shaped hollow space and the acoustic radiation surface serves as a bending vibration plate. One of the particular features of the echo sounder is directed to a ring-shaped piezoelectric vibrator accommodated in an outer zone of the disc-shaped space.

The ring-shaped piezoelectric vibrator may have major surfaces held in contact with the inner surface of the bending vibration plate and a surface opposite to the inner surface and an outer side surface spaced from the inner side surface between the inner surface and the opposite surface. Otherwise, the ring-shaped piezoelectric vibrator may have major surfaces spaced from the inner surface and the opposite surface and an outer side surface held in contact with the inner side surface between the inner surface and the opposite surface. Pieces of soft resilient insulator may be interposed between the inner surfaces of the front mass and the major surfaces and/or the outer side surface.

Another echo sounder according to the present invention exerts compressive force on a piezoelectric vibrator. In this instance, the bending vibratory plate is physically separable from the front mass, and the hollow space is defined between the front mass and the bending vibratory plate. The piezoelectric vibrator is put on the front mass, and the bending vibratory plate is assembled with the front mass so that the piezoelectric vibrator is confined in the hollow space. The bending vibratory plate is, by way of example, secured to the front mass by means of bolts. Then, the compressive force is exerted on the piezoelectric vibrator. Otherwise, the bending vibratory plate is pressed to the piezoelectric vibrator on the front mass, and is welded to the front mass. Then, the compressive force is exerted on the piezoelectric vibrator.

The echo sounder behaves as follows. As described in conjunction with the prior art echo sounder, the bandwidth is spread into a lower frequency range by decreasing the thickness of the bending vibratory plate or increasing the diameter of the hollow space. However, the thin bending vibratory plate is liable to be broken in the water, or is reduced in the acoustic radiation efficiency due to the deformation of the bending vibratory plate. On the other hand, the ring-shaped piezoelectric vibrator in the disc-shaped space prevents the bending vibratory plate from deformation due to the water pressure. Even if a rigid ring is provided between the inner surface and the opposite surface, the rigid ring is a mere obstacle to the bending vibrations. However, appropriate potential is applied to the ring-shaped piezoelectric vibrator in such a manner that the vibrations of the ring-shaped piezoelectric vibrator have the period and phase same as those of the vibrations of the bending vibratory plate. Thus, the ring-shaped piezoelectric vibrator enhances the withstand water pressure without any resistance against the bending vibrations of the bending vibratory plate. The bending vibrations have a node along the boundary between the bending vibratory plate and the remaining portion of the front mass so that the resonant frequency is unchanged. This is because of the fact that the ring-shaped piezoelectric vibrator vibrates synchronously with the bending vibratory plate. This means that the ring-shaped piezoelectric vibrator does not serve as any load to the bending vibratory plate. In other words, the bending vibratory plate vibrates without any influence of the ring-shaped piezoelectric vibrator so that the ring-shaped piezoelectric vibrator does not restrict the bending vibratory plate. The node is unchanged, and the resonant frequency is unchanged.

When the echo sounder is dipped in water, the bending vibratory plate is brought into contact with the ring-shaped piezoelectric vibrator under the water pressure, and the ring-shaped piezoelectric vibrator statically supports the bending vibratory plate. The bending vibratory plate held in contact with the ring-shaped piezoelectric vibrator is equivalent to a bending vibratory plate having the diameter less than that of the bending vibratory plate. Even if the compressive force is exerted on the piezoelectric vibrator, the piezoelectric vibrator exhibits large resistance against compressive force, and still has a large load driving capability through the piezoelectric effect.

The piezoelectric vibrator is located along the periphery of the bending vibratory plate. The location of the piezoelectric vibrator is desirable, because the piezoelectric vibrator gives rise to vibrations with a wide amplitude in the bending vibratory plate through the action of lever. This means a high electric-to-acoustic converting efficiency, because the vibrations, which the ring-shaped piezoelectric vibrator generates, are propagated to the bending vibratory plate after the amplification. In other words, not only passive vibrations, which the vibrator gives rise to in the front mass, but also active vibrations, which the ring-shaped piezoelectric vibrator gives rise to in the bending vibratory plate, are converted to the acoustic wave radiated from the acoustic radiation surface so that the acoustic radiation efficiency is enhanced. Especially, when the location of the ring-shaped piezoelectric vibrator is optimized, the stress, which the ring-shaped piezoelectric vibrator gives rise to therein, is effectively converted to vibrations with a wide amplitude generated in the bending vibratory plate, and the propagation of vibrations is optimized. The same effects are obtained by increasing the potential applied to the ring-shaped piezoelectric vibrator or the thickness of the ring-shaped piezoelectric vibrator.

According to the present invention, the manufacturer can optimum design the thickness of the bending vibratory plate and the measures of the hollow space for a target resonant frequency. The manufacturer can design the ring-shaped piezoelectric vibrator independently of the bending vibratory plate. The withstand water pressure is dependent on the measures of the ring-shaped piezoelectric vibrator as well as the measures of the bending vibratory plate. The independence in design between the ring-shaped piezoelectric vibrator and the bending vibratory plate makes the manufacturer to improve the withstand water pressure. Moreover, the manufacturer can determine the thickness, difference between the inner diameter and the outer diameter and the driving voltage for the ring-shaped piezoelectric vibrator. The optimization of these design parameters results in enhancement of the electric-to-acoustic converting efficiency.

In case where the echo-sounder is, by way of example, used in deep sea, two ring-shaped piezoelectric vibrators may be concentrically arranged in the hollow space.

When the difference between the inner diameter and the outer diameter is increased, the ring-shaped piezoelectric vibrator generates large force. Even if the bending vibratory plate is thin or large in diameter, the optimum designed ring-shaped piezoelectric vibrator makes the bending vibratory plate to radiate the acoustic wave against large load due to the acoustic radiation impedance.

Furthermore, the ring-shaped piezoelectric vibrator is located at the periphery of the bending vibratory plate, and does not add any mass to the bending vibratory plate. These features are desirable, because the ring-shaped piezoelectric vibrator does not make the peak of the bending vibrations at the resonant frequency sharp. If the peak of the vibrations is to be sharp, a disc-shaped piezoelectric vibrator is secured to the bending vibratory plate, and the ring-shaped piezoelectric vibrator is further provided in the hollow space.

DESCRIPTION OF THE PREFERRED EMBODIMENTS

First Embodiment

Figure 7:
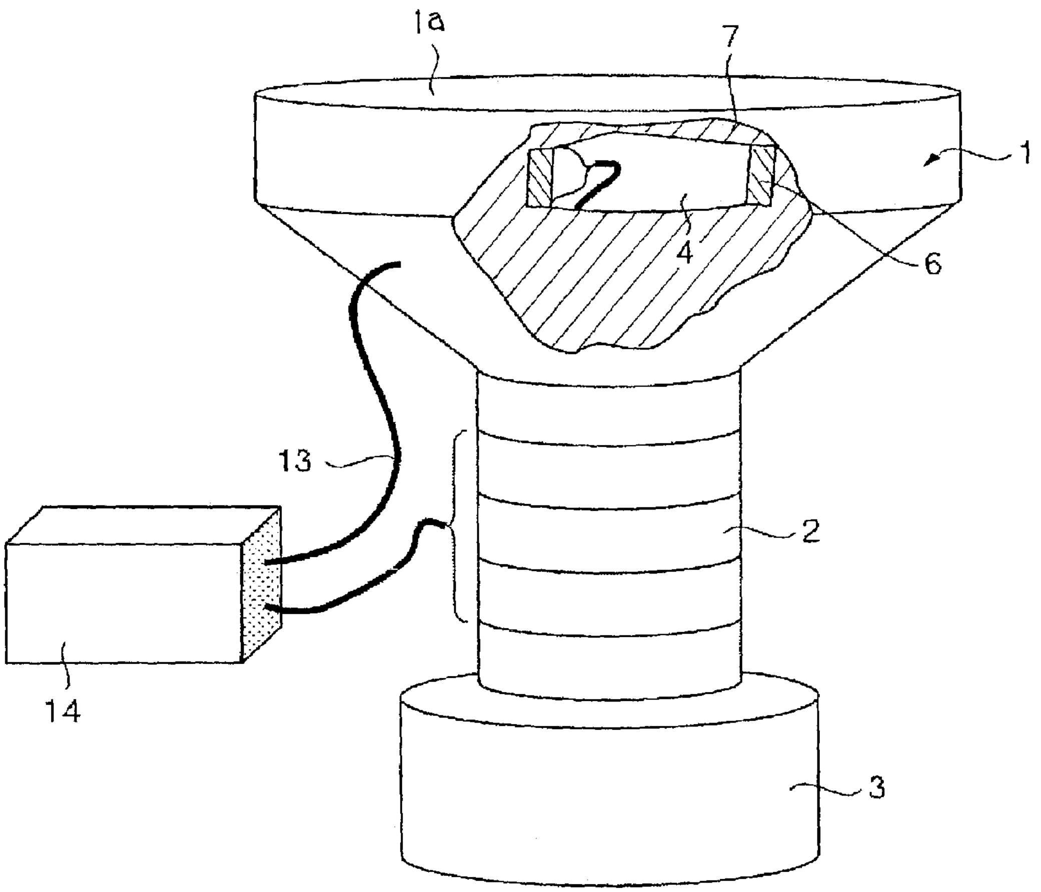
FIG. 7 is a perspective view showing the structure of an echo sounder according to the present invention.
Figure 8:
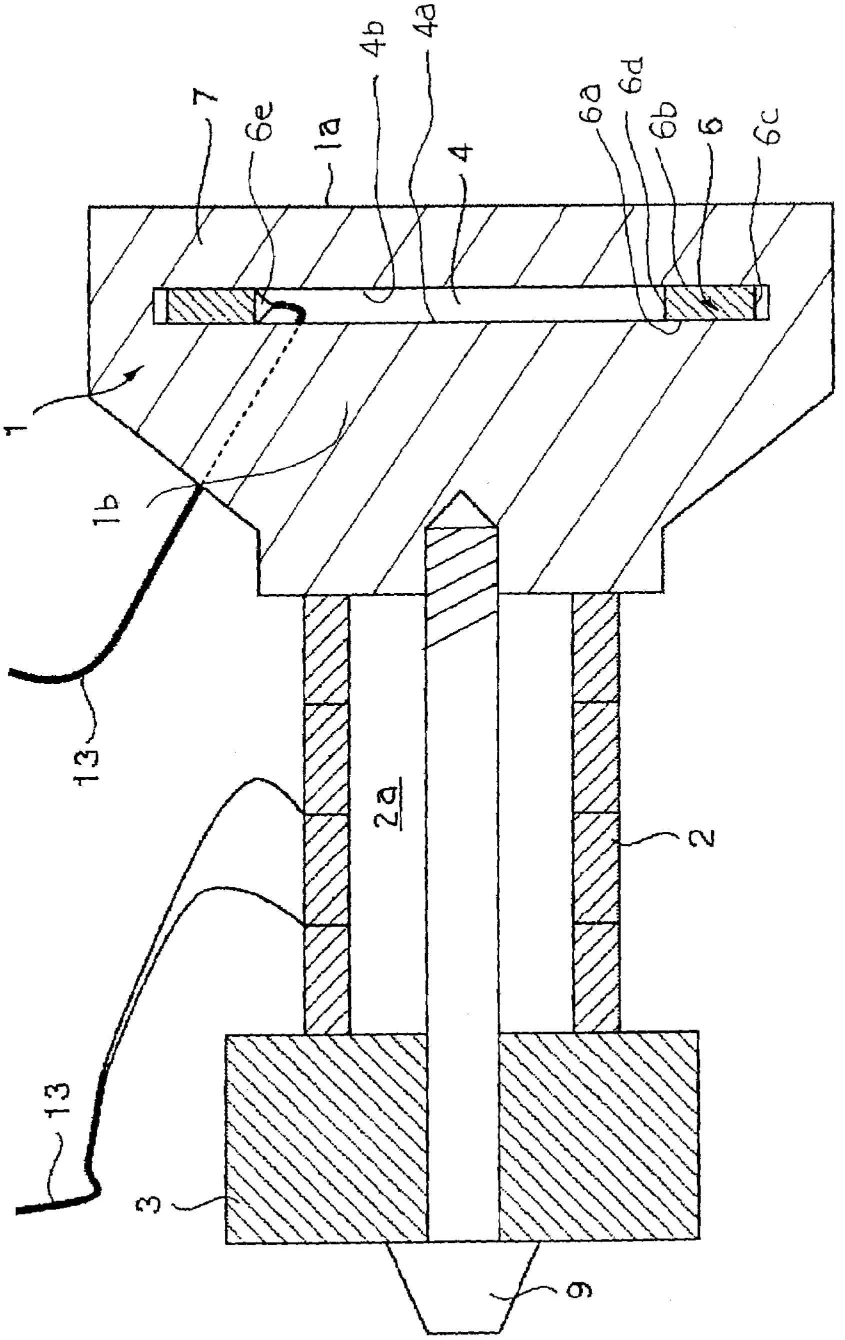
FIG. 8 is a partially cross-sectional side view showing the echo sounder.

Referring to FIGS. 7 and 8, an echo sounder embodying the present invention largely a front mass 1, a layered product of piezoelectric ceramics 2, a rear mass 3 and a bolt 9. The front mass 1 has a frusto-conical configuration, and the rear mass 3 has a contour like a disc. The wider flat surface 1*a* serves as an acoustic radiation surface. The piezoelectric ceramics 2 have a ring shape, and are layered in such a manner as to define an inner space 2*a*. A bolt hole is formed in the rear mass 3, and a female thread is formed in the front mass 1. The bolt 9 passes through the bolt hole and inner space 2*a*, and is screwed into the female thread. The layered product of the piezoelectric ceramics 2 is sandwiched between the front mass 1 and the rear mass 3, and compressive force is exerted on the layered product of piezoelectric ceramics 2. Thus, the echo-sounder has a Langevin vibrator.

A hollow space 4 is formed in the front mass 1, and has a disc configuration. The portion of the front mass 1 between the hollow space 4 and the acoustic radiation surface 1*a* serves as a bending vibratory plate 7. A ring-shaped piezoelectric vibrator 6 is accommodated in the hollow space 4, and is located in outer zone of the hollow space 4. A driving circuit 14 is connected through cables 13 to the layered product of piezoelectric ceramics 2 and the ring-shaped piezoelectric vibrator 6. When the driving circuit 14 applies a potential to the layered product of piezoelectric ceramics 2, the layered product of piezoelectric ceramics 2 is deformed, and exerts the stress to the front mass. The driving circuit 14 repeatedly causes the layered product of piezoelectric ceramics 2 to exert the stress on the front mass 1. This results in bending vibrations of the bending vibratory plate 7 as similar to those generated in the prior art echo sounder.

The ring-shaped piezoelectric vibrator 6 has flat major surfaces 6*a*/6*b*, an outer side surface 6*c* and an inner side surface 6*d*. The flat major surfaces 6*a*/6*b* are held in contact with the inner surface 4*a* of the remaining portion 1*b* of the front mass 1 and the inner surface 4*b* of the bending vibratory plate 7, respectively. However, the outer side surface 6*c* and inner side surface 6*d* are spaced from the corresponding inner surfaces of the front mass 1.

While the ring-shaped piezoelectric vibrator 6 is being energized, the ring-shaped piezoelectric vibrator 6 drives the bending vibratory plate 7 for vibrations. Namely, when the driving circuit 14 applies a potential to the ring-shaped piezoelectric vibrator, the ring-shaped piezoelectric vibrator 6 is deformed, and exerts stress on the bending vibratory plate 7. Since the bending vibratory plate 7 is merged with the remaining portion 1*b* along the outer periphery thereof, the stress gives rise to deflection of the bending vibratory plate 7. When the stress is removed from the bending vibratory plate 7, the bending vibratory plate 7 is recovered, and is received by the ring-shaped piezoelectric vibrator 6. Thus, the bending vibratory plate 7 vibrates at the designed resonant frequency without damage under the water pressure.

In case where strong vibrations are required, a disc-shaped piezoelectric vibrator is fixed to the central area of the bending vibratory plate 7, and the ring-shaped piezoelectric vibrator 6 is provided around the disc-shaped piezoelectric vibrator. The disc-shaped piezoelectric vibrator is designed to have the resonant frequency equal to that of the bending vibratory plate 7. In this instance, the stress, which is exerted on the bending vibratory plate 7 by the disc-shaped piezoelectric vibrator, is added to the stress also exerted on the bending vibratory plate 7 by the ring-shaped piezoelectric vibrator 7. Thus, the disc-shaped piezoelectric vibrator cooperates with the ring-shaped piezoelectric vibrator 7 so that they give rise to vibrations with wide amplitude of the bending vibratory plate 7. If the resonant frequency is offset, the frequency range is widened.

In the echo sounder implementing the first embodiment, the major surfaces 6*a*/6*b* of the ring-shaped piezoelectric vibrator 6 are held in contact with the inner surface of the remaining portion 1*b*, inner surface of the bending vibratory plate 7 and the boundary region therebetween. The "thickness" of the ring-shaped piezoelectric vibrator 6 is the distance between the flat major surfaces 6*a* and 6*b*. When the ring-shaped piezoelectric vibrator 6 increases the thickness thereof, the ring-shaped piezoelectric vibrator 6 decreases the diameter thereof at the Poisson's ratio, and pushes the bending vibratory plate 7. This results in that the bending vibratory plate 7 is outwardly warped. Furthermore, when the ring-shaped piezoelectric vibrator 6 decreases the diameter, the contact area with the inner surface 4*b* is forced to radially inwardly move the bending vibratory plate 7 by the aid of fulcrum at a certain point in the remaining portion 1*b*. This results in that the bending vibratory plate 7 is outwardly warped. Thus, both deformations of the ring-shaped vibrator 6 make the bending vibratory plate 7 radial inward deformation of the bending vibratory plate 7.

If the electrodes 6*e* of the ring-shaped piezoelectric vibrator 6 are short-circuited through the front mass 1, i.e., the bending vibratory plate 7 and/or the remaining portion 1*b*, insulating layers (not shown) are inserted between the flat major surfaces 6*a*/6*b* and the inner surfaces 4*a*/4*b*. The insulating layers may be non-polarized ceramic plates. Otherwise, the front mass 1 is partially or completely made of insulating material.

The echo sounder is dipped in water. In order to prevent the echo sounder from the water, the echo sounder may be molded in synthetic resin, or is water proofed against the water except for the acoustic radiation surface 1*a*.

As will be understood from the foregoing description, the ring-shaped piezoelectric vibrator 6 and the bending vibratory plate are designed independently of each other. The appropriately designed ring-shaped piezoelectric vibrator 6 supports the outer periphery of the appropriately designed bending vibratory plate 7 so that the bending vibratory plate 7 withstands high water pressure.

The measures of the bending vibratory plate 7 such as the thickness and diameter are determined without taking the withstand water pressure into account. The echo sounder is spread in a low frequency range, and a board-band echo sounder is obtained.

The ring-shaped piezoelectric vibrator 6 does not add any mass to the bending vibratory plate so that the bending vibratory plate does not exhibit any sharp peak at the resonant frequency.

Second Embodiment

Figure 9B:
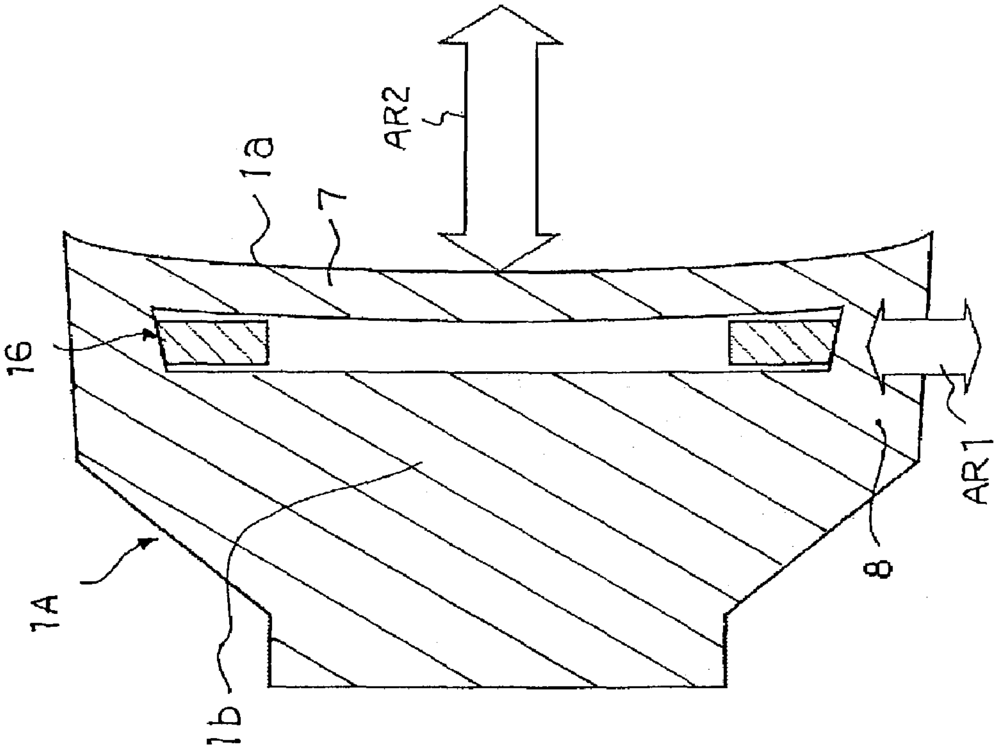
FIGS. 9A and 9B are cross sectional views showing the structure of a front mass incorporated in another echo sounder according to the present invention.
Figure 9A:
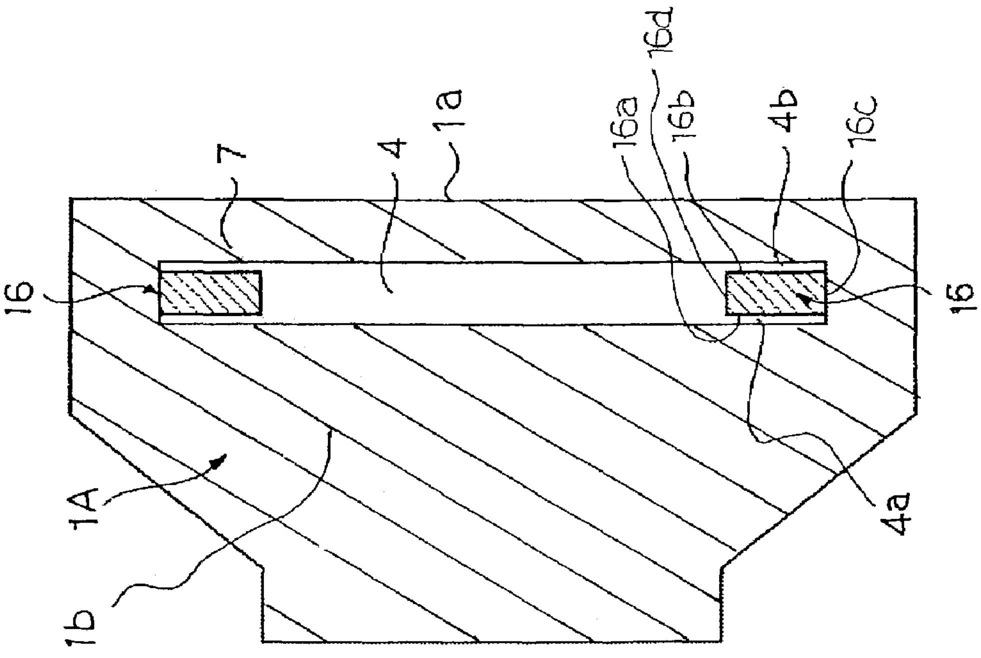

Turning to FIGS. 9A and 9B of the drawings, a front mass 1A, which forms a part of another echo sounder embodying the present invention, has a frusto-conical configuration. Other component parts of the echo sounder are similar to those of the echo sounder implementing the first embodiment, and are not shown in FIGS. 9A and 9B.

The front mass 1A is also formed with the disc-shaped hollow space 4, and a ring-shaped piezoelectric vibrator 16 is accommodated in the disc-shaped hollow space 4. The flat major surfaces 16*a*/16*b* are spaced from the inner surfaces of the front mass 1A, and an outer side surface 16*c* is held in contact with the inner surface of the front mass 1A as shown. Gaps 4*a*/4*b* takes place between the flat major surfaces 16*a*/16*b* and the inner surfaces of the front mass 1A.

Electrodes (not shown) are provided on the outer and inner side surfaces 16*c*/16*d* so that a potential applied thereto gives rise to vibrations in "31 mode" as indicted by arrow AR1. The vibrations in the 31 mode are called as "respiration vibrations", and make the ring-shaped piezoelectric vibrator 16 repeatedly increase and decrease the diameter.

The ring-shaped piezoelectric vibrator 16 is assumed to increase the diameter. The front mass 1A offers a fulcrum at 8 to the ring-shaped piezoelectric vibrator 16 so that the ring-shaped piezoelectric vibrator 16 pushes the boundary between the bending vibratory plate 7 and the remaining portion 1*b* outwardly. The force exerted on the boundary makes the bending vibratory plate 7 inwardly warped. When the potential is removed from the ring-shaped piezoelectric vibrator 16, the ring-shaped piezoelectric vibrator 16 and, accordingly, bending vibratory plate 7 are recovered. Thus, the ring-shaped piezoelectric vibrator 16 gives rise to vibrations as indicated by arrow AR2 in FIG. 9B. Although the ring-shaped piezoelectric vibrator 16 increases the thickness at a Poisson's ratio, the ring-shaped piezoelectric vibrator 16 does not brings the flat major surfaces 16*a*/16*b* into contact with the inner surfaces of the front mass 1A. For this reason, the ring-shaped piezoelectric vibrator 16 is freely deformed, and does not serve as an obstacle against the deformation of the bending vibratory plate 7. Thus, the ring-shaped piezoelectric vibrator 16 drives the bending vibratory plate 7 for vibrations at a high efficiency.

The fulcrum 8 and contact area between the ring-shaped piezoelectric vibrator 16 and the front mass 1A are designed in such a manner that the amplitude of the bending vibratory plate 7 is wider than the amplitude of the ring-shaped piezoelectric vibrator 16 through an action of lever.

The echo sounder implementing the second embodiment achieves all the advantages of the first embodiment.

Third Embodiment

Figure 10B:
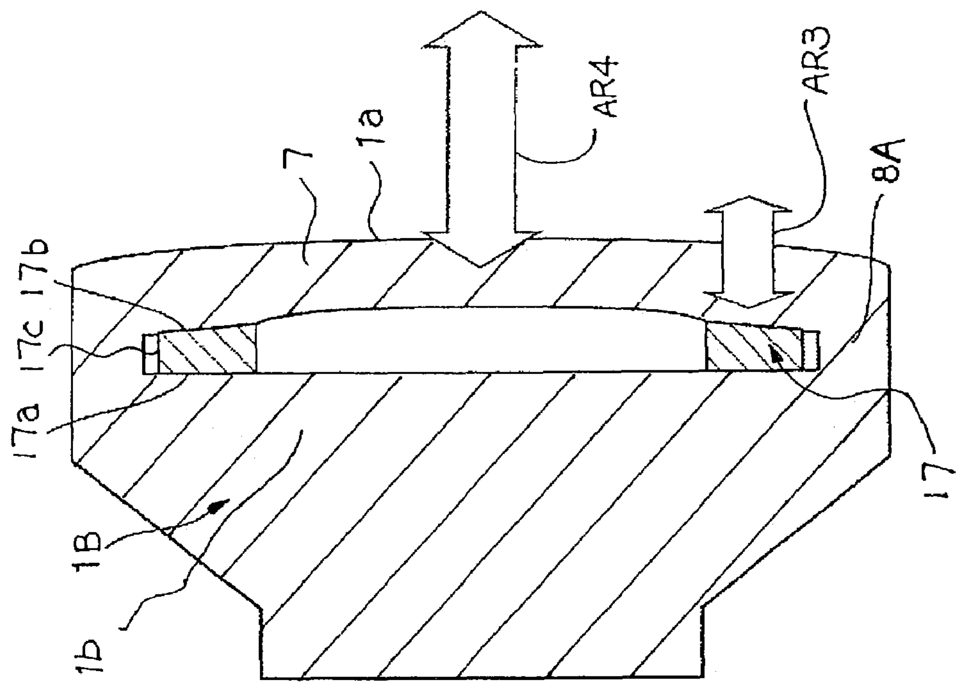
FIGS. 10A and 10B are cross sectional views showing the structure of a front mass incorporated in yet another echo sounder according to the present invention.
Figure 10A:
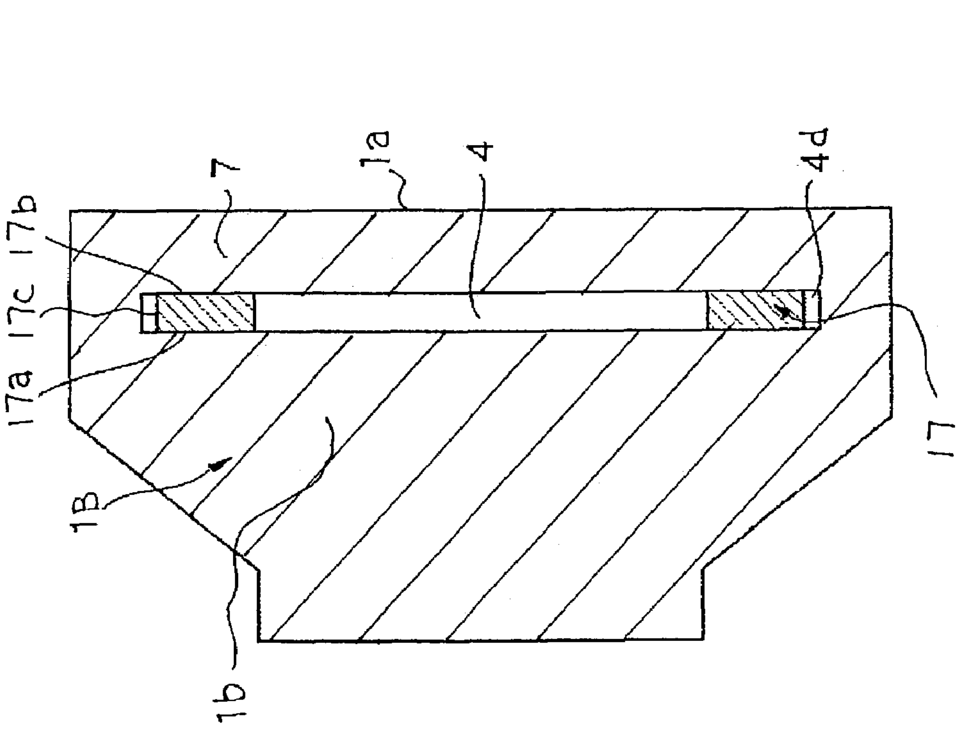

Turning to FIGS. 10A and 10B, a front mass 1B forms a part of yet another echo sounder embodying the present invention. Other component parts of the echo sounder are similar to those of the echo sounder implementing the first embodiment, and are not shown in FIGS. 10A and 10B.

The front mass 1B is also formed with the disc-shaped hollow space 4, and a ring-shaped piezoelectric vibrator 17 is accommodated in the disc-shaped hollow space 4. The flat major surfaces 17*a*/17*b* are held in contact with the inner surfaces of the front mass 1B. However, the outer side surface 17*c* is spaced from the inner surface of the front mass 1B, and a gap 4*d* takes place between the outer side surface 17*c* and the inner surface as shown in FIG. 10A. Electrodes (not shown) are provided on the flat major surfaces 17*a*/17*b*.

When a potential is applied between the electrodes, the ring-shaped piezoelectric vibrator 17 gives rise to vibrations in 33 mode. The ring-shaped piezoelectric vibrator 17 increases and decreases the thickness thereof in 33 mode as indicated by arrow AR3. The front mass 1B offers a fulcrum 8A to the ring-shaped piezoelectric vibrator 17 so that the bending vibratory plate 7 is outwardly warped. Although the ring-shaped piezoelectric vibrator 17 increases the diameter at a Poisson's ratio, the gap 4*d* permits the ring-shaped piezoelectric vibrator 17 to increase the diameter without any contact with the inner surface of the front mass 1B. This results in that the ring-shaped piezoelectric vibrator 17 drives the bending vibratory plate 7 at a high efficiency. When the deformation is removed from the ring-shaped piezoelectric vibrator 17, the bending vibratory plate 7 is recovered. Thus, the ring-shaped piezoelectric vibrator 18 exerts stress on the bending vibratory plate 7, and gives rise to bending vibrations as indicated by arrow AR4 in FIG. 10B. The fulcrum 8A and contact portions between the flat major surfaces 17*a*/17*b* and the inner surfaces are designed in such a manner that the amplitude of the bending vibratory plate 7 is wider than the amplitude of the ring-shaped piezoelectric vibrator 17 through the action of lever.

The echo sounder implementing the first embodiment is equipped with the ring-shaped piezoelectric vibrator 6 having the flat major surfaces 6*a*/6*b* held in contact with the inner surface of the remaining portion 1*b*, inner surface of the bending vibratory plate 7 and boundary therebetween. For this reason, the total contact area between the ring-shaped piezoelectric vibrator 6 and the front mass 1 is so wide that the stress is not uniformly dispersed in the ring-shaped piezoelectric vibrator 6. This means that the ring-shaped piezoelectric vibrator 6 is liable to be broken and generate heat.

On the other hand, the ring-shaped piezoelectric vibrators 16/17 are held in contact with the front masses 1A/1B only at the outer side surface 16*c* and flat major surfaces 17*a*/17*b*. Although the stress-to-deformation converting efficiency is reduced, the stress is fairly uniformly dispersed in the ring-shaped piezoelectric vibrators 16/17. For this reason, the ring-shaped piezoelectric vibrators. 16/17 are hardly broken.

In the front mass 1A/1B, the lever has a fulcrum at the boundary between the bending vibratory plate 7 and the remaining portion 1*b*, and effort is generated at the intermediate line between the inner side surface and the outer side surface for the load at the bending vibratory plate 7. Thus, the amplitude is increased by virtue of the principles of lever and fulcrum.

Fourth and Fifth Embodiments

Figure 11:
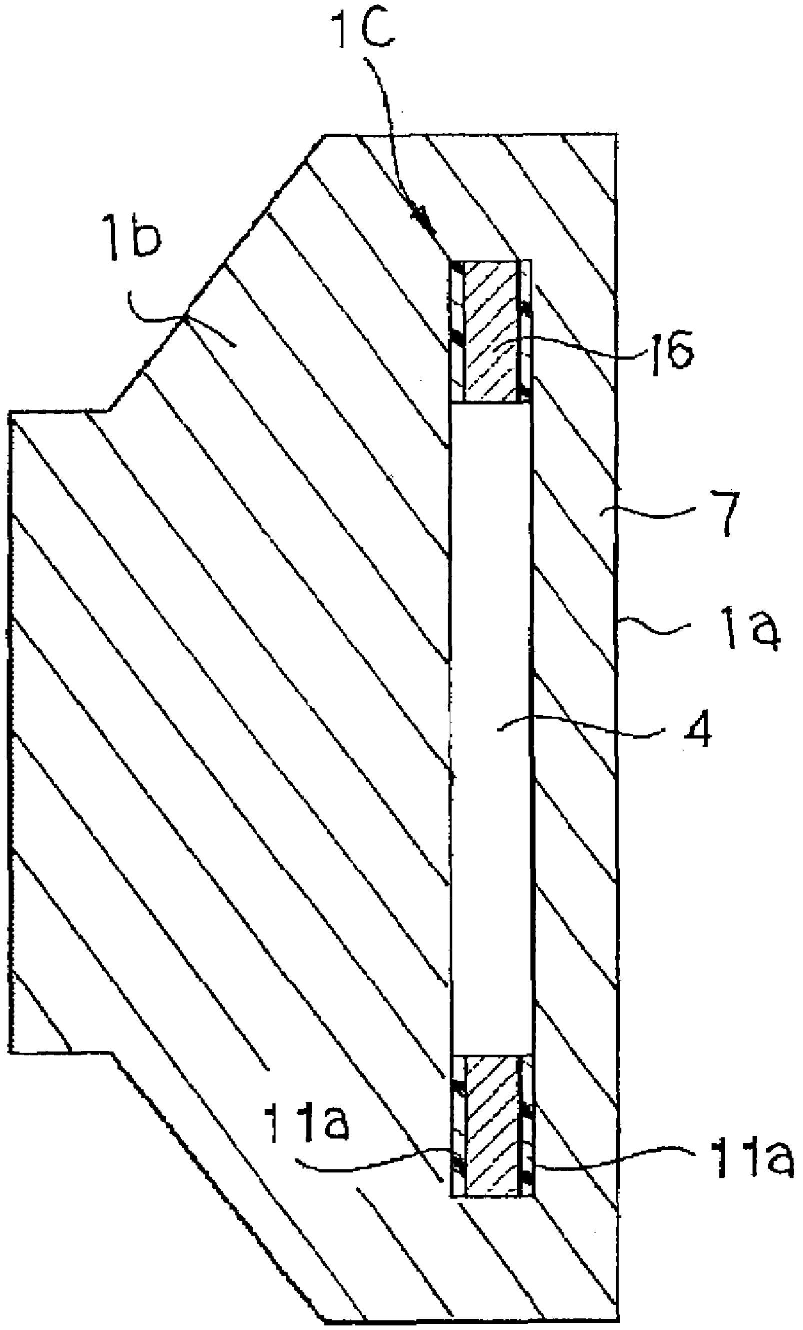
FIG. 11 is a cross sectional view showing the structure of a front mass incorporated in still another echo sounder according to the present invention.
Figure 12:
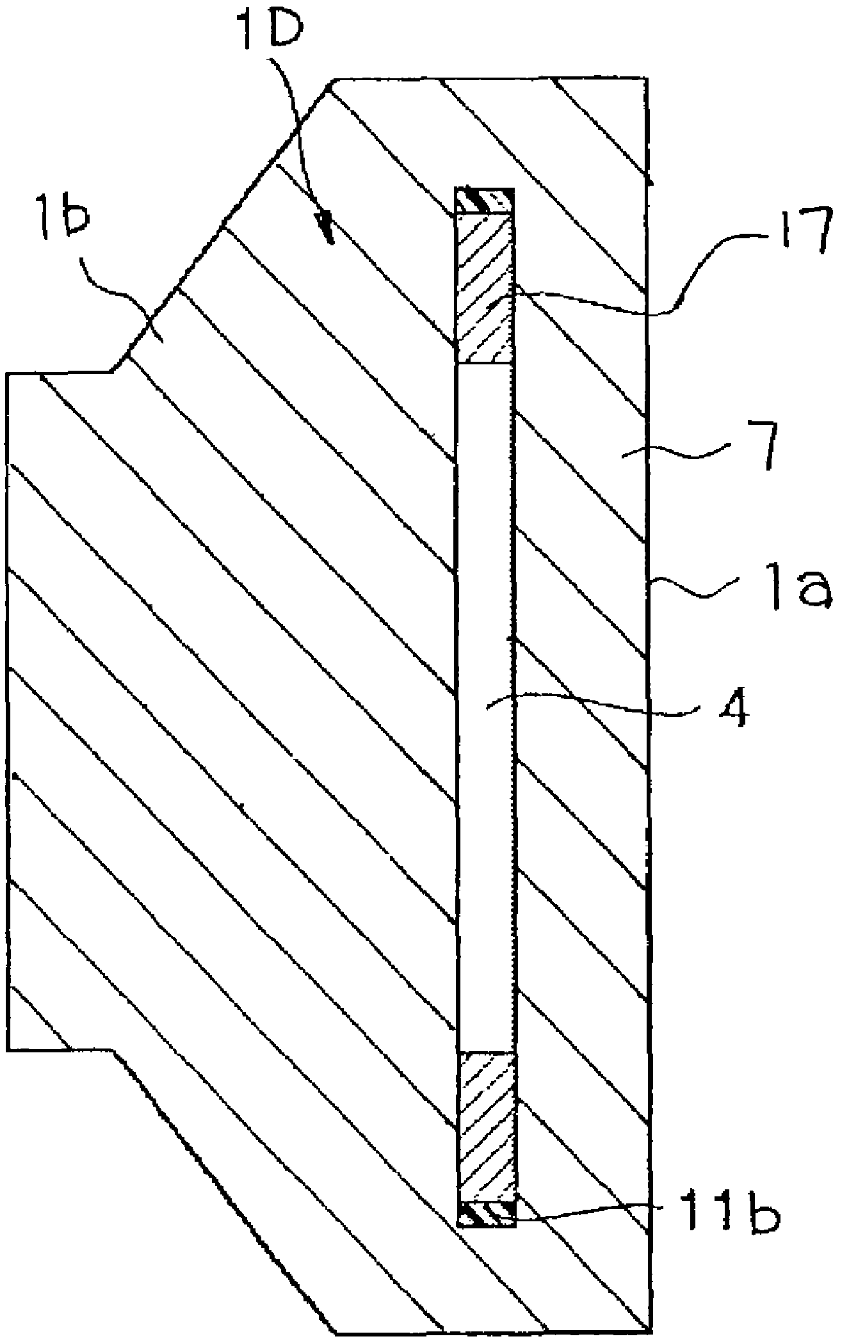
FIG. 12 is a cross sectional view showing the structure of a front mass incorporated in yet another echo sounder according to the present invention.

FIGS. 11 and 12 respectively show front masses 1C/1D incorporated in echo sounders implementing the fourth and fifth embodiments. The front masses 1C/1D are based on the front masses 1A/1B, respectively. For this reason, the front masses 1C and 1D are like the front masses 1A/1B except for electrically insulating resilient layers 11*a*/11*b*. The other component parts and portions are labeled with references designating corresponding parts and portions of the front masses 1A/1B without detailed description.

The electrically insulating resilient layers 11*a* are inserted into the gaps 4*a*/4*b*, and prevent the electrodes (not shown) on the flat major surfaces 16*a*/16*b* from short-circuit. On the other hand, the electrically insulating resilient layer 11*b* is inserted into the gap 4*d*, and prevents the electrode (not shown) from short-circuit.

In the echo sounders implementing the first and second embodiments, the electrodes (not shown) are merely isolated from the front masses 1A/1B by the gaps 4*a*/4*b* and 4*d*. If the gaps 4*a*/4*b* and 4*c* are too narrow, the heat, which is internally generated in the ring-shaped piezoelectric vibrators 16/17, cause the electrodes to be brought into contact with the inner surfaces of the front masses 1A/1B through the thermal expansion. The electrically insulating resilient layers 11*a*/11*b* make the electrical isolation between the electrodes and the front masses 1C/1D perfect. Since the electrically insulating resilient layers 11*a*/11*b* have the resiliency, the electrically insulating resilient layers 11*a*/11*b* permit the ring-shaped piezoelectric vibrators 16/17 to vibrate in the 31/33 modes without any serious resistance.

Soft insulating resilient material is desirable for the electrically insulating resilient layers 11*a*/11*b*. Examples of the soft insulating resilient material are rubber and synthetic resin. Silicone rubber has the structural resiliency, and is preferable for the electrically insulating resilient layers 11*a*/11*b*.

Sixth Embodiment

Figure 13:
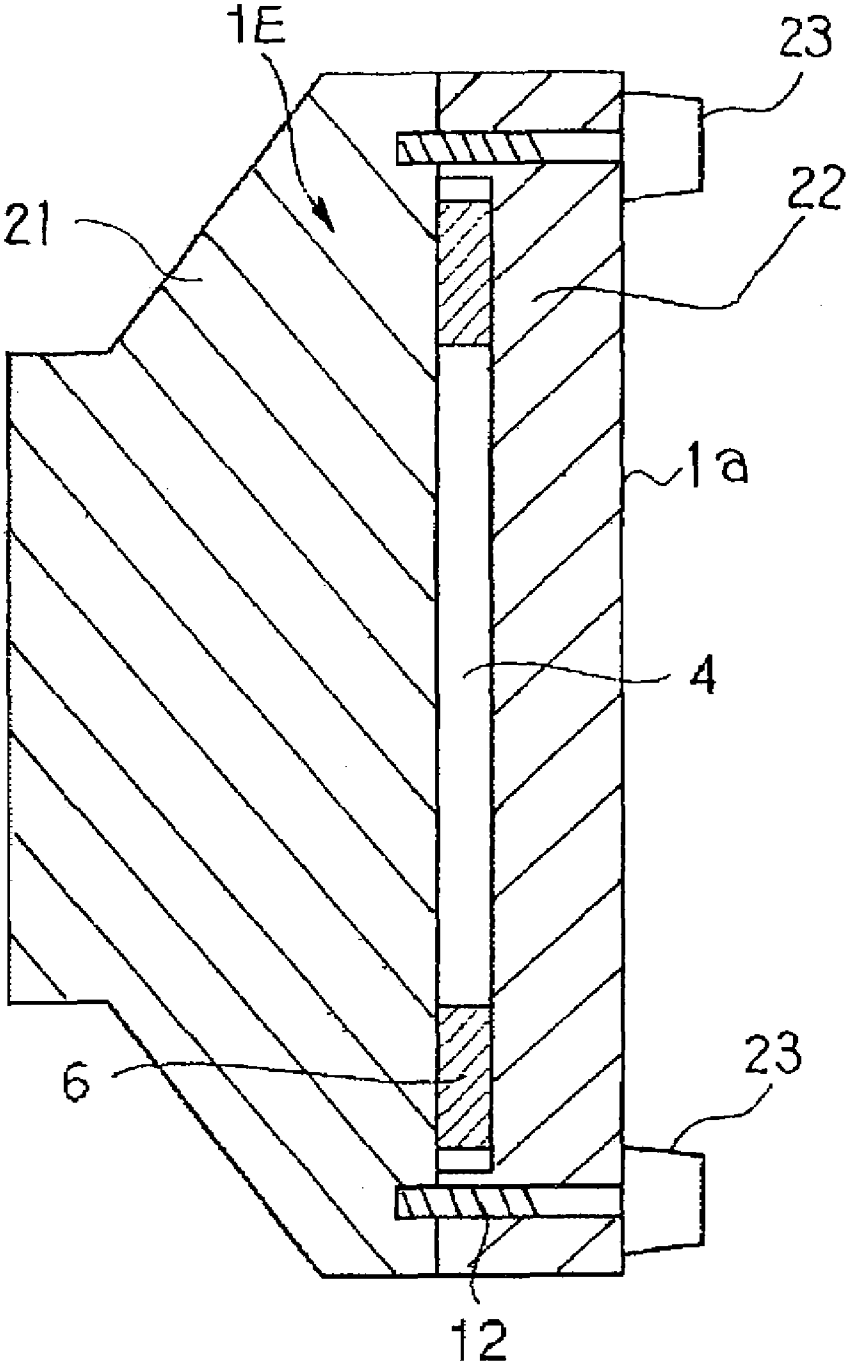
FIG. 13 is a cross sectional view showing the structure of a front mass incorporated in still another echo sounder according to the present invention.

FIG. 13 shows a front mass 1E incorporated in an echo sounder embodying the present invention. The other component parts of the echo sounder implementing the sixth embodiment are similar to those of the first embodiment. For this reason, description is made on the front mass 1E.

The front mass 1E is split into a remaining portion 21 and a bending vibratory plate 22. The rear surface of the bending vibratory plate 22 is partially depressed, and is secured to the remaining portion 21 by means of bolts 23. The rear surface is spaced from the remaining portion by several millimeters. When the bending vibratory plate 22 is assembled with the remaining portion 21, a hollow space 4 takes place for a ring-shaped piezoelectric vibrator 6. The ring-shaped piezoelectric vibrator 6 is slightly thicker than the hollow space 4. For this reason, the bending vibratory plate 22 exerts compressive force on the ring-shaped piezoelectric vibrator 6. The compressive force is preferable, because the ring-shaped piezoelectric vibrator 6 generates vibrations with wide amplitude.

Seventh Embodiment

Figure 14:
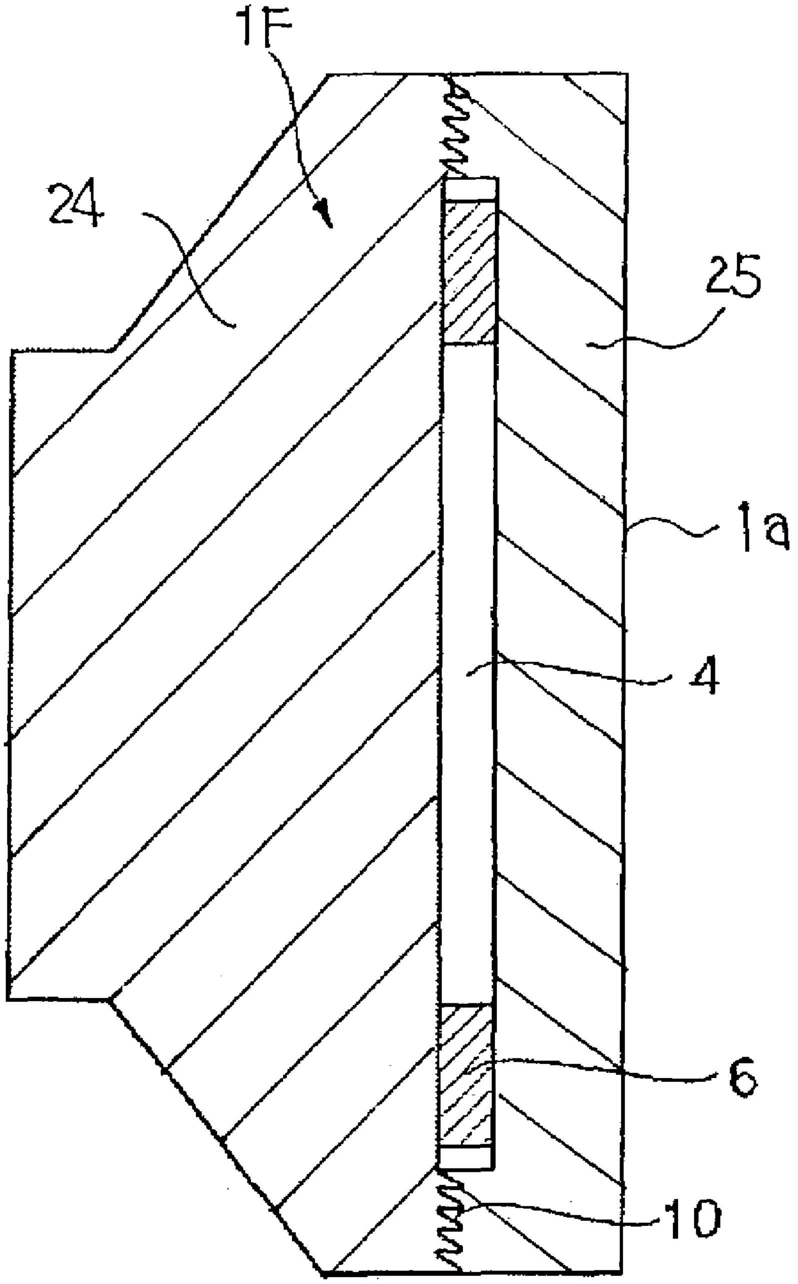
FIG. 14 is a cross sectional view showing the structure of a front mass incorporated in yet another echo sounder according to the present invention.

FIG. 14 shows a front mass 1F incorporated in an echo sounder embodying the present invention. The other component parts of the echo sounder implementing the seventh embodiment are similar to those of the first embodiment. For this reason, description is made on the front mass 1F.

The front mass 1F is also sprit into a remaining portion 24 and a bending vibratory plate 25. The rear surface of the bending vibratory plate 25 is also depressed so that a hollow space 4 takes place between the remaining portion 24 and the bending vibratory plate 25. The hollow space 4 is of the order of several millimeters thick. A ring-shaped piezoelectric vibrator 6 is slightly thicker than the hollow space 4 so that compressive force is exerted on the ring-shaped piezoelectric vibrator 6.

The bending vibratory plate 25 and remaining portion 24 are assembled into the front mass 1F as follows. First, the ring-shaped piezoelectric vibrator 6 is put on the depressed rear surface, and the remaining portion 24 is assembled with the bending vibratory plate 25. Force is exerted on the bending vibratory plate 25 and the remaining portion 24. The bending vibratory plate 25 and remaining portion 24 keep the ring-shaped piezoelectric vibrator 6 compressive, and are welded together along the contact surface 10. Thus, the compressive force is exerted on the ring-shaped piezoelectric vibrator 6 without any mechanical element such as bolts.

Driving Method

Acoustic wave is radiated from the acoustic radiation surfaces 1*a* of the echo sounders. As described hereinbefore, the ring-shaped piezoelectric vibrator gives rise to vibrations in 31 mode or 33 mode. The respiration vibrations take place in 31 mode. The vibrations in 33 mode are hereinbefore referred to as "thickness vibrations". The echo sounder implementing the second embodiment is, by way of example, driven for the respiration vibrations, and the echo sounder implementing the third embodiment is driven for the thickness vibrations, by way of example. For this reason, description is focused on these echo sounders.

In order to drive the ring-shaped piezoelectric vibrator for the respiration vibrations, the electrodes are formed on the outer side surface 16*c* and inner side surface 16*d*, and a driving voltage is applied between the electrodes. The ring-shaped piezoelectric vibrator 16 has been polarized in the direction between the inner side surface 16*c* and the outer side surface 16*d*. When the driving voltage is applied, the ring-shaped piezoelectric vibrator 16 is expanded and shrunk in the direction of the circumstance. Thus, the direction of respiration vibrations is perpendicular to the direction of polarization, and is called as "transversal effect longitudinal vibrations", i.e., the vibrations in 31 mode. Since the piezoelectric vibrator 16 has the ring shape, the expansion and shrinkage in the direction of the circumstance is observed as the increase and decrease in the direction of the diameter. For this reason, the transversal effect longitudinal vibrations are called as the respiration vibrations.

On the other hand, the echo sounder shown in FIGS. 10A and 10B has the ring-shaped piezoelectric vibrator 17, the electrodes of which are formed on the flat major surfaces 17*a*/17*b*. The ring-shaped piezoelectric vibrator 17 is polarized in the direction between the flat major surfaces 17*a* and 17*b*. When a driving voltage is applied between the electrodes, the ring-shaped piezoelectric vibrator 17 is expanded and shrunk in the direction between the flat major surfaces 17*a* and 17*b*. Thus, the direction of vibrations is same as the direction of the polarization. For this reason, the vibrations in 33 mode are called as "longitudinal effect longitudinal vibrations".

Although the converting efficiency is low, a ring-shaped piezoelectric vibrator, which forms a part of an echo sounder according to the present invention, may be driven for the respiration vibrations in 31 mode by using the electrodes formed on the flat major surfaces, and another ring-shaped piezoelectric vibrator, which also forms a part of another echo sounder according to the present invention, may be driven for the thickness vibrations in 31 mode by using the electrodes formed on the inner side surface and the outer side surface.

It is necessary to drive the ring-shaped piezoelectric vibrators 6/16/17 according to the present invention for the vibrations at the resonant frequency of the bending vibratory plate 7. However, the phase of the driving voltage applied to the layered products of piezoelectric ceramics 2 tightened with the bolt 9 is not always consistent with the phase of the driving voltage applied to the ring-shaped piezoelectric vibrators 6/16/17. When the phase of driving voltages is determined, the designer takes the driving conditions of the piezoelectric vibrators and the relation of resonant frequency between the bending vibratory plate 7 and the bolt-tightened Langevin vibrator 2 into account.

The ring-shaped piezoelectric vibrator 17 is held in contact with the inner surface of the remaining portion 1*b* and the inner surface of the bending vibratory plate 7, and is driven for the vibrations in 33 mode by using the electrodes formed in the flat major surfaces. In case where the resonant frequency of the bending vibratory plate 7 is higher than the resonant frequency of the bolt-tightened Langevin vibrator 2, the bending vibrations of the bending vibratory plate 7 is almost same in phase as the longitudinal vibrations of the bolt-tightened Langevin vibrator 2, and the driving signal applied to the ring-shaped piezoelectric vibrator 17 is an in-phase signal of the driving signal applied to the bolt-tightened Langevin vibrator 2. As a result, when the bending vibratory plate 7 is warped outwardly, the bolt-tightened Langevin vibrator 2 exerts the driving force on the bending vibratory plate 7 for outwardly projecting it.

If the resonant frequency of the bending vibratory plate 7 is lower than the resonant frequency of the bolt-tightened Langevin vibrator 2, the vibrations of the bending vibratory plate 7 around the resonant frequency is almost anti-phase of the vibrations of the longitudinal vibrations of the bolt-tightened Langevin vibrator 2. For this reason, the driving voltage applied to the ring-shaped piezoelectric vibrator is to be anti-phase of the driving signal applied to the bolt-tightened Langevin vibrator 2. When the bolt-tightened Langevin vibrator 2 exerts the force, which makes the bending vibratory plate 7 outwardly warped, on the bending vibratory plate 7, the bending vibratory plate 7 starts to be inwardly warped. Thus, the driving signals, which are anti-phase to each other, are desirable.

The ring-shaped piezoelectric vibrator 16 has the outer side surface 16*c* held in contact with the inner surface of the front mass 1A and the flat major surfaces 16*a*/16*b* spaced from the opposite inner surfaces. When the ring-shaped piezoelectric vibrator 16 increases the diameter, the bending vibratory plate 7 is inwardly warped as shown in FIG. 9B. In case, where the resonant frequency of the bending vibratory plate 7 is higher than the resonant frequency of the bolt-tightened Langevin vibrator 2, the ring-shaped piezoelectric vibrator 16 and bolt-tightened Langevin vibrator 2 are to be driven with the driving voltage signals anti-phase to each other. On the other hand, if the resonant frequency of the bending vibratory plate 7 is lower than the resonant frequency of the bolt-tightened Langevin vibrator 2, the ring-shaped piezoelectric vibrator 16 and bolt-tightened Langevin vibrator 2 are to be driven with the in-phase driving voltage signals.

As will be understood from the foregoing description, the phase of the driving voltage signals is to be determined in consideration of the force-transmitted path from the ring-shaped piezoelectric vibrators 16/17, the driving technology for the piezoelectric vibrators 2 and 16/17 and the relation between the resonant frequency of the bending vibratory plate 7 and the resonant frequency of the bolt-tightened Langevin vibrator 2.

The driving signals applied to a ring-shaped piezoelectric vibrator and a Langevin vibrator may be neither in-phase nor anti-phase. This means that the driving circuit 14 is expected to keep the driving signals in a certain phase difference.

Moreover, not only the fundamental resonant frequencies of the Langevin vibrator/ring-shaped piezoelectric vibrator but also high-order bending vibrations may be controllable by optimizing the location of ring-shaped piezoelectric vibrator, driving voltage and frequency characteristics of phase. This results in a broad-band echo sounder.

The driving circuit 14 includes oscillating circuits for independently supplying the driving signals to the vibrators. Another driving circuit may have an oscillating circuit for directly supplying a driving circuit to one of the vibrators and a phase circuit connected to the oscillator for introducing a certain phase difference into the driving signal.

A lead wire may pass through a hole formed in the front mass 1/1A to 1F so as to reach the ring-shaped piezoelectric vibrator. The hole is so thin that the hole does not have serious influence on the vibration characteristics of the front mass.

As will be appreciated from the foregoing description, the vibrator 6/16/17 is only held in contact with the front mass, but is not fixed to the bending vibratory plate 7. This feature is desirable, because the manufacturer can design the bending vibratory plate 7 and vibrator 6/16/17 independently of one another, and the resonant frequency of the bending vibratory plate 7, withstand water pressure of echo sounder, thickness/diameter of the vibrator 6/16/17 are independently optimized. The bending vibratory plate 7 is designed from the viewpoints of the resonant frequency and the withstanding water pressure of the echo sounder, and the vibrator 6/16/17 is designed from the viewpoint of the output power and amplitude of vibrations. Flat frequency characteristics are obtainable. Thus, the vibrator 6/16/17 and bending vibratory plate 7 not fixed to each other enhances the design flexibility of the echo sounder.

Moreover, in case where the echo sounder is to radiate an acoustic wave at a low frequency, the manufacturer can design the bending vibratory plate without consideration of the withstand water pressure, because the vibrator 6/16/17 reinforces the bending vibratory plate. When the water pressure is exerted on the bending vibratory plate, the vibrator 6/16/17 in the peripheral zone statically supports the bending vibratory plate 7 in the zone along the periphery of the bending vibratory plate 7, and makes the bending vibratory plate 7 equivalent to a bending vibratory plate with a small diameter. If the vibrator 6/16/17 is made of piezoelectric ceramic, the piezoelectric vibrator 6/16/17 exhibits a large resistance against the compressive force without sacrifice of the load-driving capability.

The vibrator 6/16/17 is physically separable from the bending vibratory plate 7. This means that the vibrator 6/16/17 does not add any mass to the bending vibratory plate 7. Moreover, the vibrator 6/16/17 does not give serious resistance against the vibrations of the bending vibratory plate 7. For this reason, the bending vibratory plate 7 does not exhibit a sharp peak at the resonant frequency. In other words, it is possible to design an echo sounder with flat output characteristics over a wide frequency range.

The vibrator 6/16/17 is driven for the vibrations synchronously with the bending vibrations of the bending vibratory plate 7. This means that the vibrator 6/16/17 does not serve as a load to the bending vibratory plate 7, and the bending vibratory plate 7 vibrates without serious influence of the vibrator 6/16/17. In other words, the bending vibratory plate 7 still has the node of vibrations at the boundary to the remaining portion 1*b*, and does not have any node at the contact area with the vibrator 6/16/17. The resonant frequency of the bending vibratory plate 7 is unchanged. Thus, the vibrator 6/16/17 is not causative of any high-order vibrations, and the echo sounder achieves a high acoustic radiation efficiency.

Finally, the maximum amplitude of the vibrations takes place in the bending vibratory plate 7 through the amplification of the vibrations produced by the vibrator 6/16/17 under the condition of matching with the acoustic radiation impedance. This results in the high electric-to-acoustic converting efficiency. The vibrator 6/16/17, which is located at the zone along the periphery of the bending vibratory plate 7, increases the amplitude of the vibrations in the bending vibratory plate 7 through the action of lever, and the high electric-to-acoustic converting efficiency is achieved by virtue of the appropriately located vibrator 6/16/17. The bending vibratory plate 7 is in the passive vibrations, and the vibrator 6/16/17 gives rise to active vibrations in the bending vibratory plate 7. Thus, the optimum location of the vibrator 6/16/17 exerts the stress on the bending vibratory plate 7 so as to give rise to the active vibrations in the bending vibratory plate 7 at the high transmission efficiency. The same effect is achieved by increasing the thickness of the vibrator 6/16/17 or the driving voltage.

Although particular embodiments of the present invention have been shown and described, it will be apparent to those skilled in the art that various changes and modifications may be made without departing from the spirit and scope of the present invention.

Although the Langevin vibrator of the echo sounder has the bolted structure, the present invention appertains to an echo sounder with a non-bolted Langevin vibrator.

A vibrator incorporated in the echo sounder according to the present invention may be made of electrostrictive material, and a direct-current bias voltage is applied to the vibrator for generating vibrations.

The ring-shaped piezoelectric vibrator for the vibrations in 33 mode may be divided into pieces of piezoelectric material. In this instance, the “ring-shape” is not the indispensable feature.

What is claimed is:

1. An echo sounder for radiating an acoustic wave, comprising:

a front mass including a bending vibratory plate portion vibratory for radiating said acoustic wave and a remaining portion, wherein the bending vibratory plate portion has a lower surface and the remaining portion has an upper surface opposite to said lower surface of the bending vibratory plate and an inner side surface connecting said lower surface of the bending vibratory plate and said upper surface of the remaining portion, thereby defining a hollow space;

a rear mass spaced from said front mass;

a first vibrator sandwiched between said front mass and said rear mass, and giving rise to vibrations of said bending vibratory plate portion; and a second vibrator accommodated in said hollow space, and having at least one surface held in contact with said front mass without being fixed to said bending vibratory plate so as to enlarge said vibrations, said second vibrator being a ring-shaped piezoelectric ceramic plate, wherein said ring-shaped piezoelectric ceramic plate has an inner curved side surface defining an inner space, an outer curved side surface held in contact with the inner side surface of said remaining portion, and an upper flat major surface and an opposite lower flat major surface connecting said inner curved side surface and said outer curved side surface, said upper and lower flat major surfaces spaced from said lower surface of the bending vibratory plate portion and said upper surface of the remaining portion respectively.

2. The echo sounder as set forth in claim 1, in which said first vibrator is a Langevin vibrator.

3. The echo sounder as set forth in claim 2, in which said Langevin vibrator includes a layered product of piezoelectric ceramics, and a compressive force is exerted on the layered product of piezoelectric ceramics.

4. The echo sounder as set forth in claim 3, in which said front mass and said rear mass exert said compressive force on said layered product of piezoelectric ceramics by means of a bolt.

5. The echo sounder as set forth in claim 1, in which said second vibrator is made of electrostrictive material.

6. The echo sounder as set forth in claim 5, in which said electrostrictive material is piezoelectric ceramic.

7. The echo sounder as set forth in claim 1, in which a driving voltage is applied between said inner curved side surface and said outer curved side surface so that said ring-shaped piezoelectric ceramic plate is expanded and shrunk in a direction of circumference thereof.

8. The echo sounder as set forth in claim 7, in which said driving voltage is an in-phase signal of a driving signal applied to said first vibrator.

9. The echo sounder as set forth in claim 7, in which said driving voltage is an anti-phase signal of a driving signal applied to said first vibrator.

10. The echo sounder as set forth in claim 1, in which electrically insulating resilient layers are provided between said flat major surfaces and said inner surfaces.

11. The echo sounder as set forth in 1, in which said ring-shaped piezoelectric ceramic plate has an inner curved side surface defining an inner space, an outer curved side surface spaced from an inner surface of said front mass and flat major surface extending in parallel between said inner curved side surface and said outer curved side surface and held in contact with inner surfaces of said front mass.

12. The echo sounder as set forth in claim 11, in which a driving voltage is applied between said flat major surfaces so that said ring-shaped piezoelectric ceramic plate increases and decreases the thickness thereof.

13. The echo sounder as set forth in claim 12, in which said driving voltage as an in-phase signal of a driving signal applied to said first vibrator.

14. The echo sounder as set forth in claim 12, in which said driving voltage as an in-phase signal of a driving signal applied to said first vibrator.

15. The echo sounder as set forth in claim 11, in which an electrically insulating resilient layer is provided between said outer curved side surface and said inner surface of said front mass.

16. The echo sounder as set forth in claim 11, in which a compressive force is exerted on said major surfaces.

17. The echo sounder as set forth in claim 16, in which said front mass includes a bending vibratory plate serving as said bending vibratory plate portion and a block serving as said remaining portion and assembled with said bending vibratory portion for defining said hollow space, and said bending vibratory plate and said block are pressed to said flat major surfaces by means of bolts.

18. The echo sounder as set forth in claim 16, in which said front mass includes a bending vibratory plate serving as said bending vibratory plate portion and a block serving as said remaining portion and assembled with said bending vibratory portion for defining said hollow space, and said bending vibratory plate and said block are welded to each other under the condition that said bending vibratory plate and said block were pressed to said flat major surfaces.

19. The echo sounder as set forth in claim 1, further comprising a third vibrator fixed to said bending vibratory plate portion.

* * * * *